United States Patent [19]

Dam et al.

[11] Patent Number: 5,271,133

[45] Date of Patent: Dec. 21, 1993

[54] METHOD FOR MAKING A PIEZOELECTRIC STACK

[75] Inventors: Chuong Q. Dam, Peoria; Kurtis C. Kelley, Washington, both of Ill.

[73] Assignee: Caterpillar Inc., Peoria, Ill.

[21] Appl. No.: 948,045

[22] Filed: Sep. 21, 1992

[51] Int. Cl.⁵ .............................................. H01L 41/22
[52] U.S. Cl. .................... 29/25.35; 310/328; 310/338; 310/340; 310/342
[58] Field of Search ............... 29/25.35; 310/328, 338, 310/340, 342

[56] References Cited

U.S. PATENT DOCUMENTS

| | | | |
|---|---|---|---|
| 3,187,242 | 6/1965 | Schick | 317/261 |
| 3,501,099 | 3/1970 | Benson | 239/535 |
| 3,589,345 | 6/1971 | Benson | 123/32 E |
| 4,011,474 | 3/1977 | O'Neill | 310/8.7 |
| 4,078,284 | 3/1978 | Capek et al. | 29/25.35 |
| 4,228,482 | 10/1980 | Bouchard et al. | 361/321 |
| 4,514,247 | 4/1985 | Zola | 156/250 |
| 4,970,182 | 11/1990 | Shirasaki | 501/134 |

FOREIGN PATENT DOCUMENTS

3123916C1 4/1983 Fed. Rep. of Germany .
48-38483 9/1971 Japan .
57-23287 7/1980 Japan .

*Primary Examiner*—Carl E. Hall
*Attorney, Agent, or Firm*—David M. Masterson

[57] ABSTRACT

A method for making a piezoelectric stack. The stack includes a plurality of piezoelectric discs interleaved with a plurality of electrodes. Each disc has two opposing surface facets. Each electrode has a thin planar section having two opposing planar surfaces. The planar section is adapted to contact a substantial portion of the surface facets of two adjacent discs. The method includes the steps of cutting a cylindrical piezoelectric ceramic slug into discs. The two opposing surface facets of each disc is formed substantially parallel to one another and have a predetermined surface roughness. The method includes the steps of applying a conductive layer to the surface facets and etching the planar surfaces of the electrodes with an acidic solution. The etching step causes the planar surfaces to achieves a surface roughness similar to that of the predetermined surface roughness of the disc surface facets. Finally, the method includes the step of alternatively interleaving a first and second plurality of electrodes with a plurality of discs to form the piezoelectric stack.

6 Claims, 7 Drawing Sheets

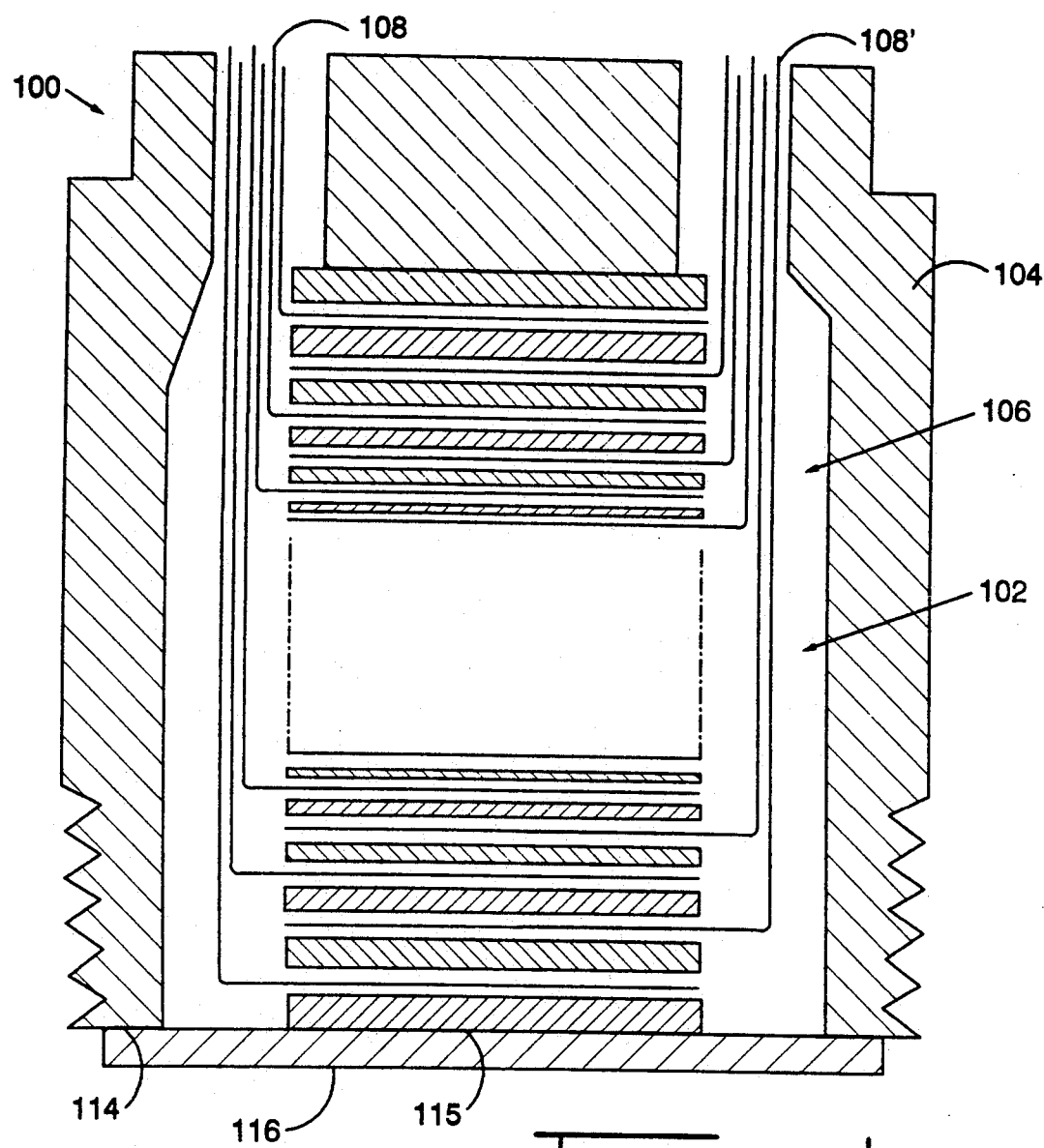
Fig_1_
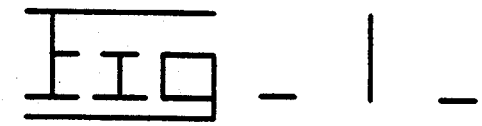
Fig_2_

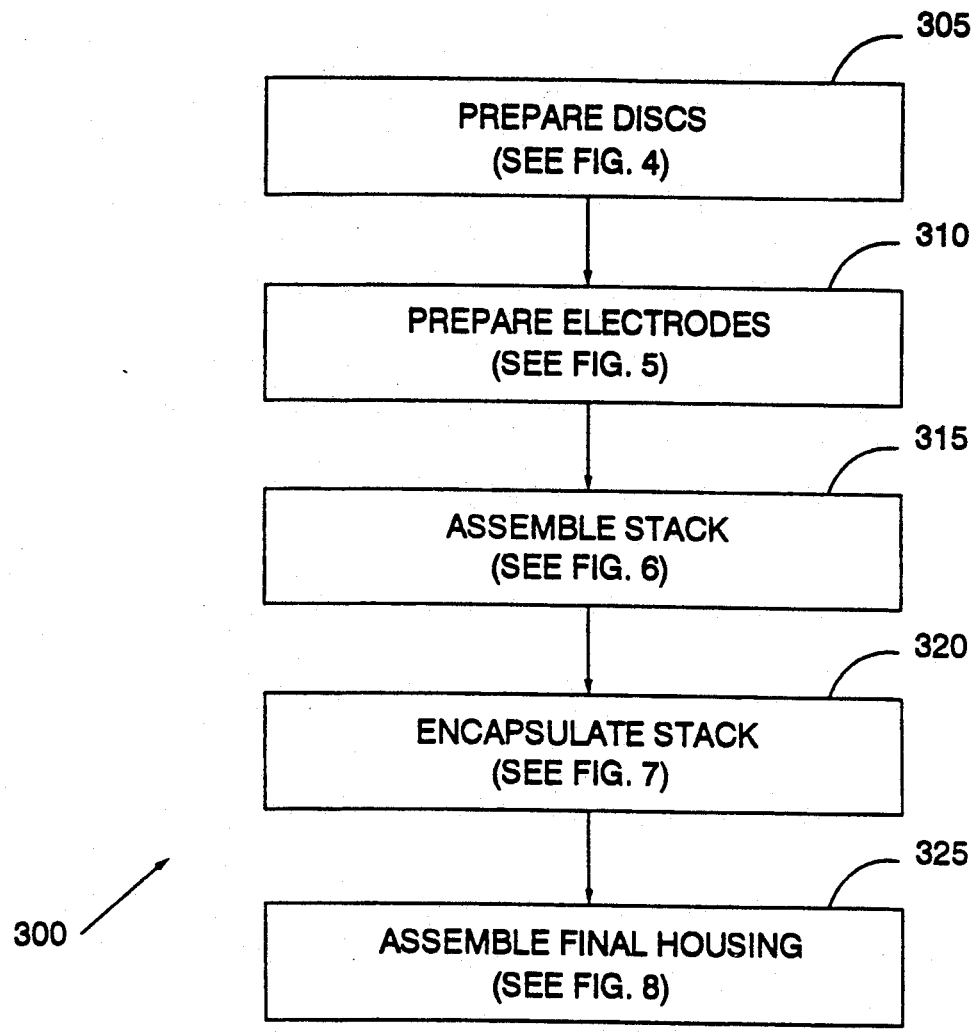
Fig_3_

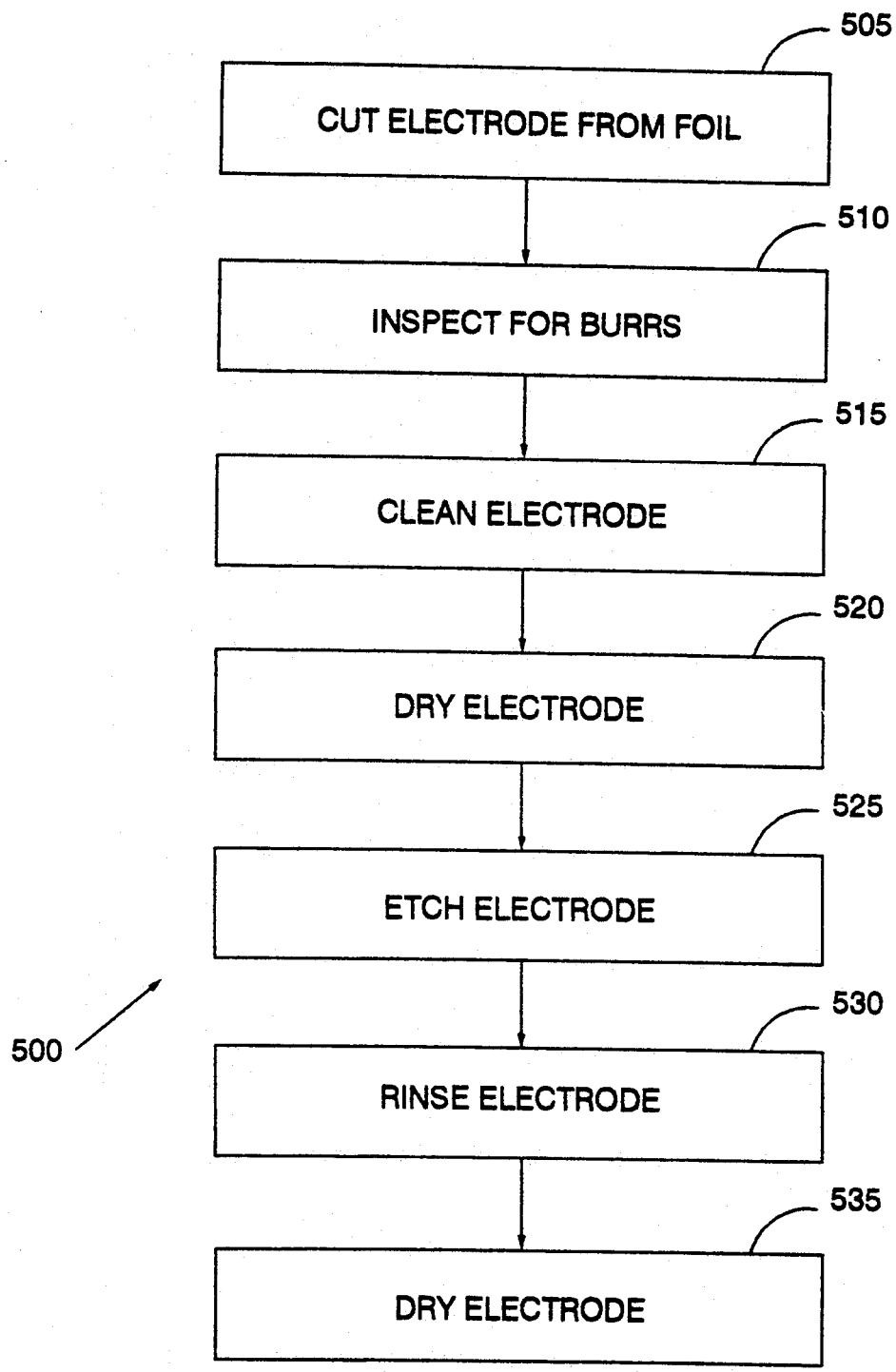
Fig_5_

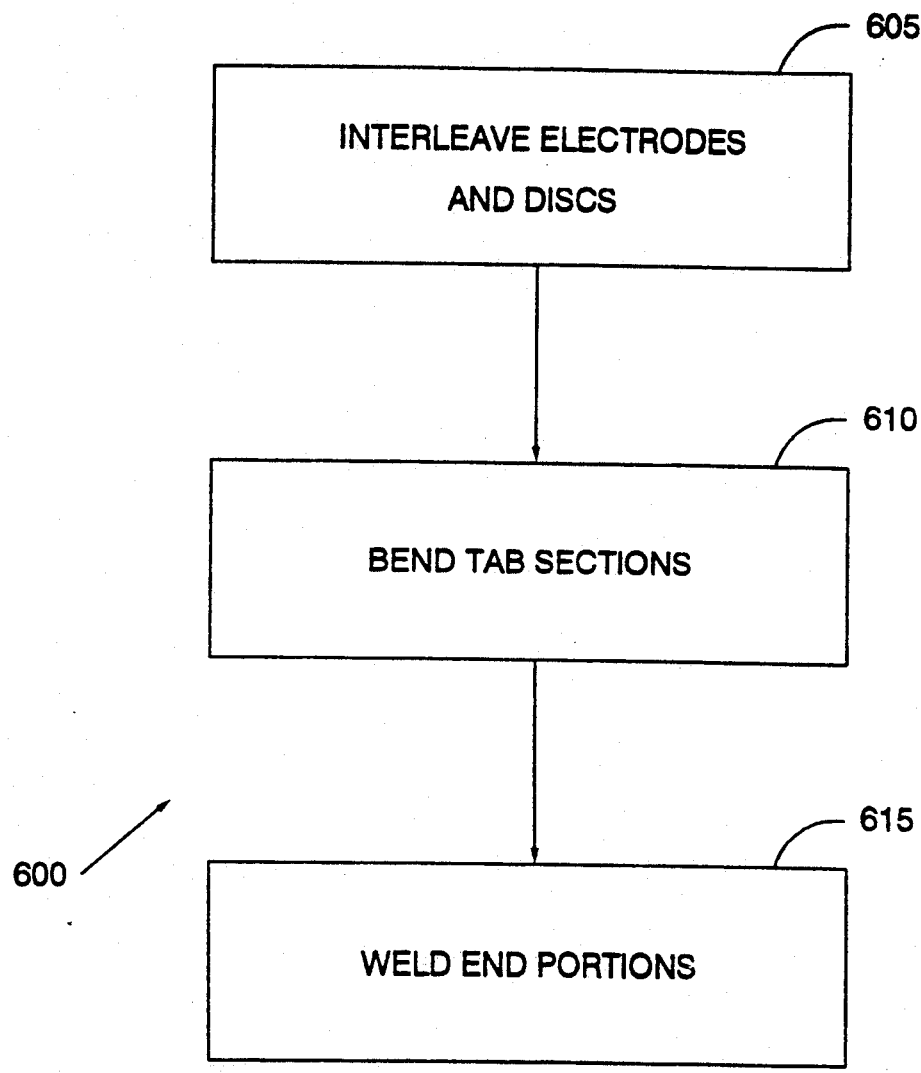

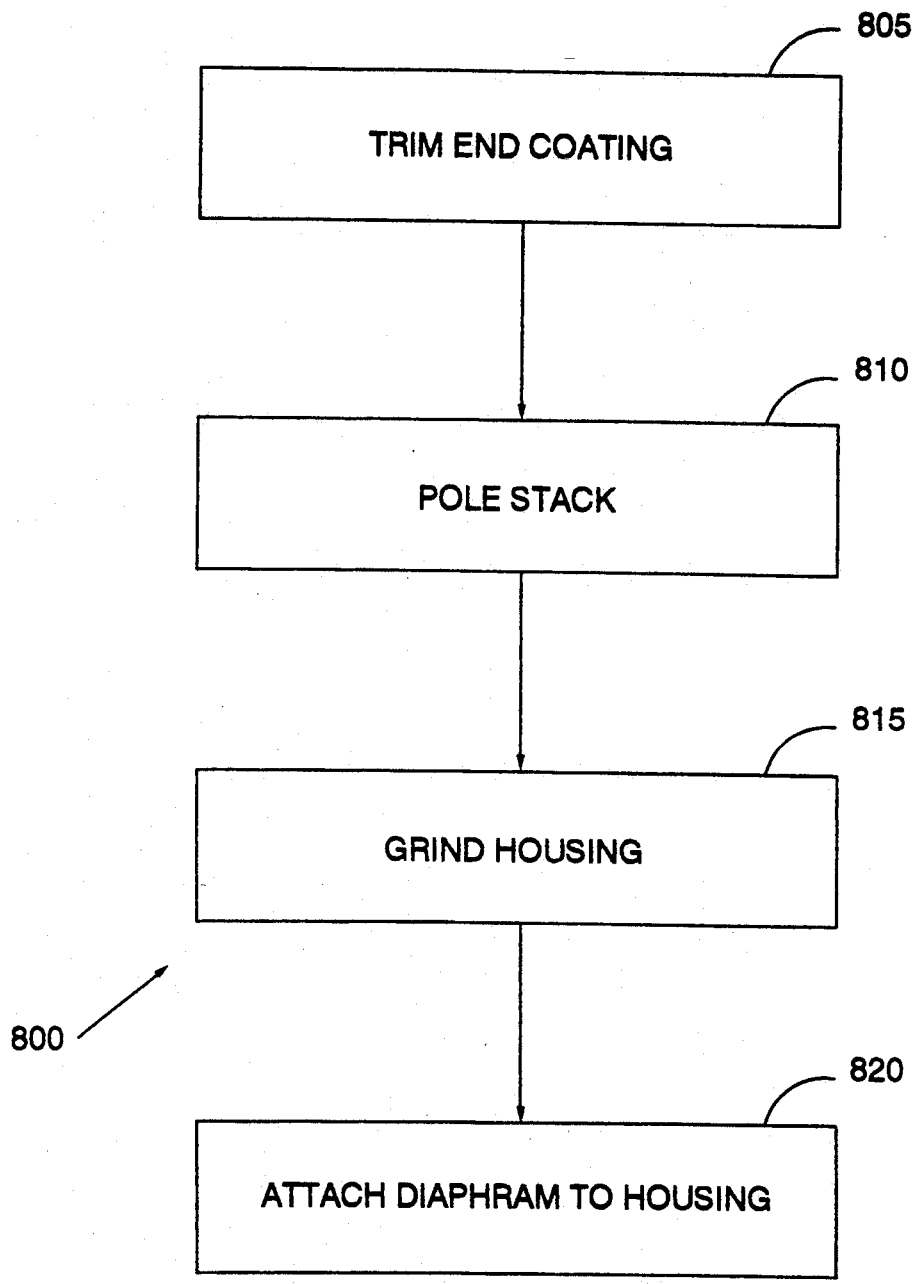
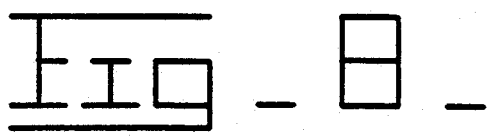

METHOD FOR MAKING A PIEZOELECTRIC STACK

DESCRIPTION

1. Technical Field

This invention relates generally to a method for making a piezoelectric stack and, more particularly, to method which etches electrodes for use in a piezoelectric stack.

2. Background Art

The usage of piezoelectric stacks have grown considerably in the past decade. The primary function of a piezoelectric stack is to provide displacement. A typical configuration of a piezoelectric stack consists of a plurality of discs interleaved with metal electrodes all aligned in a column. One end of the stack is fixed so that the other end may be displaced. Electrical energy is applied to the discs via the electrodes causing the individual discs to expand. The additive expansion of the discs yields the displacement of the stack. The stack is capable of providing high forces at fast rates. However, problems occur when the stack is utilized in high force applications.

The design of conventional piezoelectric stacks, for example the piezoelectric stack described in U.S. Pat. No. 3,501,099 to Glendon M. Benson, have inherent design problems under high forces applications. For example, the electrodes and discs comprising Benson's piezoelectric stack have smooth surfaces. When the stack is encapsulated, substantially no amount of encapsulant can seep to the electrode/disc juncture. Thus, the discs and electrodes may separate during operation. Further, the discs may slip causing stack failure.

One solution to these problems is utilizing a cutting technique which allows the discs to have a predetermined amount of surface roughness. When the discs and electrodes are assembled, a large number of microscopic spaces appear at the electrode/disc juncture. This allows the encapsulant to fill the microscopic spaces and effectively bonds the stack together. However, the large number of microscopic spaces causes the stack to become "spongy". That is, when energy is applied to the individual discs the resultant disc expansion fills the microscopic spaces reducing the stack displacement. Thus, the stack may not be able to provide the required amount of displacement or force.

The present invention is directed to overcoming one or more of the problems as set forth above.

DISCLOSURE OF THE INVENTION

In one aspect of the present invention, a method for making a piezoelectric stack is disclosed. The stack includes a plurality of piezoelectric discs interleaved with a plurality of electrodes. Each disc has two opposing surface facets. Each electrode has a thin planar section having two opposing planar surfaces. The planar section is adapted to contact a substantial portion of the surface facets of two adjacent discs. The method includes the steps of cutting a cylindrical piezoelectric ceramic slug into discs. The two opposing surface facets of each disc is formed substantially parallel to one another and have a predetermined surface roughness. The method includes the steps of applying a conductive layer to the surface facets and etching the planar surfaces of the electrodes with an acidic solution. The etching step causes the planar surfaces to achieves a surface roughness similar to that of the predetermined surface roughness of the disc surface facets. Finally, the method includes the step of alternatively interleaving a first and second plurality of electrodes with a plurality of discs to form the piezoelectric stack.

BRIEF DESCRIPTION OF THE DRAWINGS

For a better understanding of the present invention, reference may be made to the accompanying drawings in which:

FIG. 1 shows a piezoelectric solid state motor stack make by the present invention;

FIG. 2 shows the electrode design of the solid state motor;

FIG. 3 is a block diagram of the generalized method of the present invention;

FIG. 5 is a block diagram of the basic steps of a method for preparing the electrodes in connection with the present invention;

FIG. 6 is a block diagram of the basic steps of a method for assembling the electrodes and discs in connection with the present invention;

FIG. 8 is a block diagram of the basic steps of a method for assembling the housing in connection with the present invention.

BEST MODE FOR CARRYING OUT THE INVENTION

Figure 4:
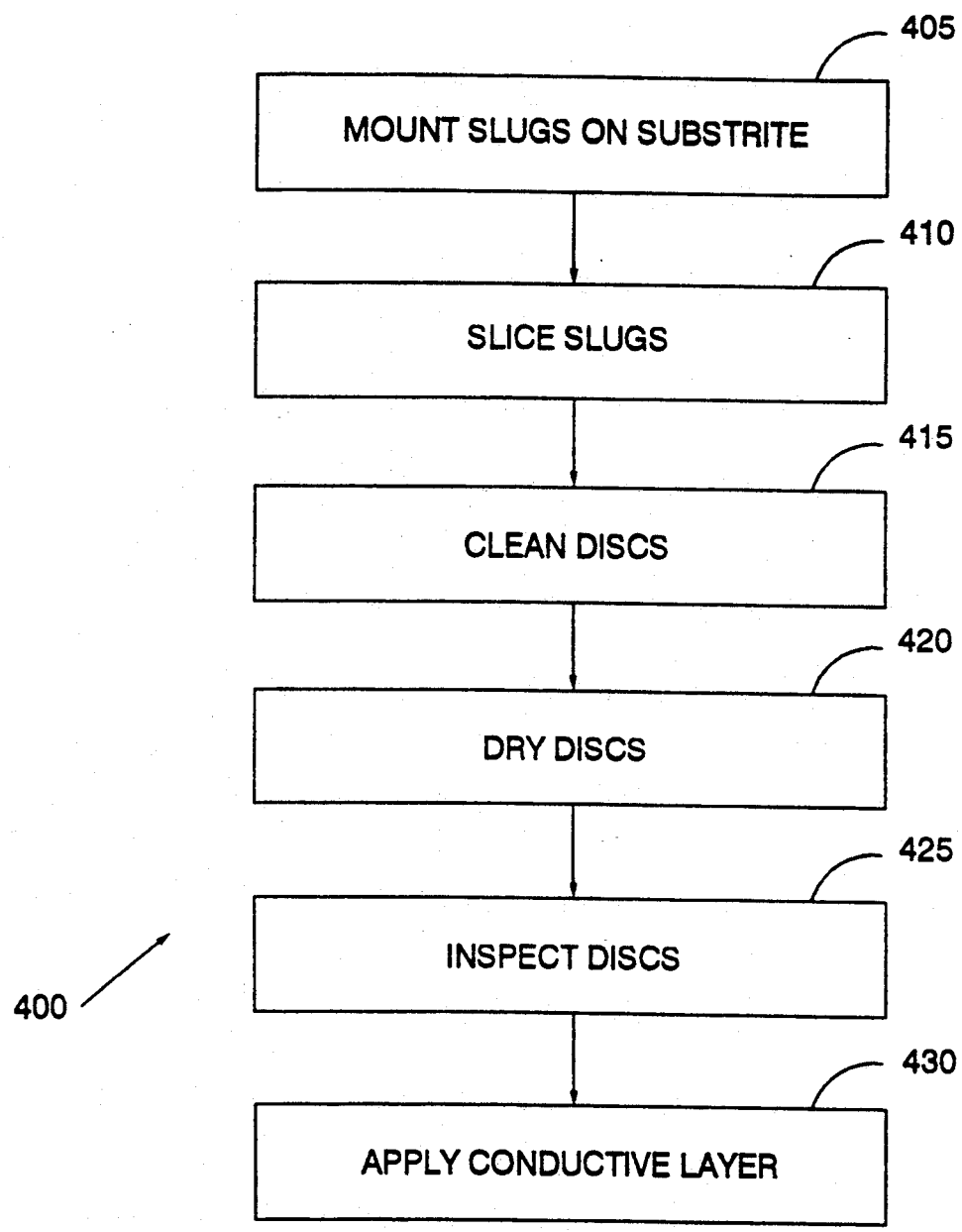
FIG. 4 is a block diagram of the basic steps of a method for preparing the ceramic discs in connection with the present invention.

Broadly, the present method for making piezoelectric stacks is designed to yield high-quality, high-durability piezoelectric solid state motor stacks.

FIG. 1 shows a housed piezoelectric solid state motor stack 100. An electrode/ceramic disc stack 102 is centered in a housing 104. The housing 104 may be formed of hardened steel and is cylindrical in shape with a hollow cylindrical cavity for housing the stack. The stack 102 includes a plurality of piezoelectric discs 106. Each disc 106 has two opposing surfaces facets. The discs 106 are alternatively interleaved with two sets of electrodes 108,108'.

The basic structure of each electrode 108,108' is discussed with reference to FIG. 2. Each individual electrode 108,108' includes a thin planar section 220 and an elongate section 222. The planar section 220 of each electrode is adapted to contact a substantial portion of the opposing surface facets of two adjacent discs. The electrodes 108,108' have an end portion 224, which when assembled is disposed beyond the housing 102 as shown in FIG. 1.

Referring to FIG. 3, a block diagram is shown of the representative steps in a generalized method of the present invention. It should be understood that the present invention is directed to a method of manufacturing piezoelectric stacks for use in high force applications. The terms piezoelectric and electroexpansive in this discussion are considered to be synonymous.

As shown in FIG. 3, the first step in the process or method, shown generally at by 300, is to prepare discs from ceramic slugs. The ceramic slug may be made from any conventional manufacturing technique; however, a slug make from lead-zirconium titanate ceramic powder is preferred. This step is indicated by the block 305. Electrodes are then prepared as shown in block 310. The stack is assembled with a plurality of ceramic discs stacked in an interleaved fashion with a plurality of electrodes shown by block 315. Once the stack is assembled, it is encapsulated as shown at block 320. Finally, the stack is assembled in a housing as shown at block 325.

Preparation of the ceramic discs is shown generally at 400 of FIG. 4. A plurality of slugs are first mounted in a graphite substrate using a no-load mounting wax. The mounting step is shown at block 405. Discs are then sliced or cut from the slugs as shown at block 410. Extremely thin ceramic discs are sliced using an inner diameter circular saw. A 320 grit, 0.38 mm thick diamond-studded inner diameter circular saw is preferable, although a wire-type saw may also be used. However, it is important that the saw cut the discs in a manner that yields good surface flatness and uniform thickness. Thus, the two opposing surface facets must be formed substantially parallel to one another. Further, the surface facets of the discs must be sliced in a manner that results in a predetermined surface roughness. For example, the predetermined surface roughness represents a surface finish within a range from 0.6 to 1.1 micrometers. The surface finish of the discs may be measured by a Form Taly Surf instrument manufactured by Taylor-Hobson.

In the preferred embodiment, ceramic disks of several different thicknesses are required for the piezoelectric solid state motor stack.

The wax is removed using a methanol bath. The disc cleaning, as shown at block 415, is completed with an ultra sonic cleaning using an acetone bath followed by another ultrasonic cleaning using a methanol rinse.

As shown at block 420, the discs are then dried in an oven.

The discs may inspected, as shown at 425, for microscopic cracks and other imperfections. Disc thickness and diameter are also checked. A surface space profiler may be used to measure facet surface finish, parallelism and flatness.

The last step in the disc preparation process is shown at block 430. Block 430 depicts the application of a conductive layer to each of the facet surfaces of the ceramic discs. Each facet surface is covered with a 2,000*10$^{-10}$ m. coating of copper. The application of the conductive layer may be accomplished by various conventional methods such as sputter coating or the like. The conductive layer is applied to all the surface area of the surface facets of the discs except for a circumferential ring about the outer edges of the discs. The conductive layer functions to more evenly spread the electric field across the surface of the disc when a voltage is applied to an adjacent electrode in the final stack structure. The outer discs of the stack do not receive the conductive layer. Thus, the outer discs insulate the stack.

Referring now to FIG. 5 of the drawings, 500 pertains to the general preparation of the electrodes. As shown at block 505, the electrodes are cut or stamped from metal foil using techniques well known in the art. The electrodes may be formed of copper alloys such as brass, or their known equivalents. The cut electrodes have smooth planer surfaces and the edges of the electrodes may be inspected for burrs as shown in block 510. Once burrs have been removed, the electrodes are cleaned in an ultrasonic cleaner bath with a warm methanol bath. This cleaning step is shown at block 515. The electrodes are over dried at step 520. After the electrodes are dry, then the smooth planer surfaces of the electrodes are etched as shown at block 515.

An acidic solution is used to etch the electrodes. The solution is made the formula:

20 gm $FeCl_3$
1 gm $CrO_3$
5 ml HCl
100 ml $H_2O$

The solution's strength can be adjusted by adding water to effect the desired amount of electrode etching. The following method may be employed to etch the electrodes.

1. Place the electrodes in a 500 ml plastic container. The bottom of the 500 ml container must have a plurality of holes. The holes may be 3 mm diameter, for example.

2. Add 500 ml of distilled water to the base solution in a 1000 ml container.

3. Dip the 500 ml container in the solution exposing only the planar surfaces of the electrodes to the solution.

4. Expose the planar surfaces to the solution for a predetermined period of time, 3 seconds for example.

This method corrodes the electrodes to yield a surface finish of the planer surfaces within a range from 0.6 to 1.1 micrometers.

It is readily apparent to those skilled in the art that the solution may deviate from that shown and the method illustrated may be altered depending on the desired effect of etching.

After the electrodes have been etched, they are rinsed with water for a short period of time, 3 minutes for example. This is shown at block 530. The electrodes are then ready to be dried, as shown by block 535. The etched electrodes are placed in a vacuum oven at 100° C. for 1 hour, for example. After the electrodes are dry, they are ready for assembly indicated generally by 600 of FIG. 6.

At block 605, the piezoelectric stack is alternatively interleaved with a first and second plurality of electrodes 108,108' and a plurality of discs to form the stack 102. The elongate tab sections 222 of each electrode is bent about the periphery of the respective planar sections approximately 90°, at block 610. The end portions 224 of the respective pluralities of electrodes are then ultrasonic or laser welded together forming first and second electrical connections, shown by block 615.

Figure 7:
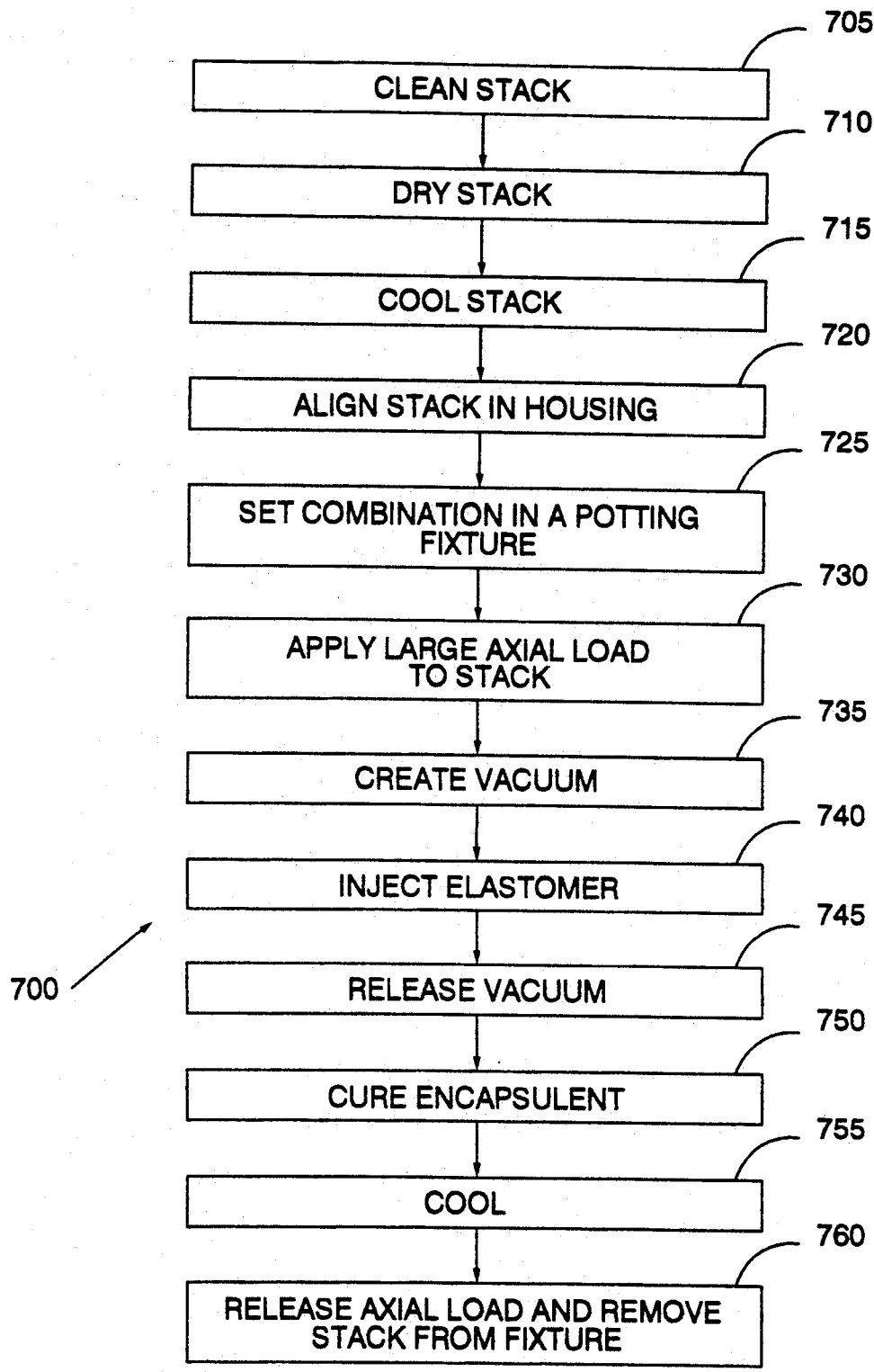
FIG. 7 is a block diagram of the basic steps of a method for encapsulating the stack in connection with the present invention.

After the stack is assembled, the stack is encapsulated, shown generally at 700 of FIG. 7. As shown at block 705, the stack undergoes a cleaning process. The stack is then ultrasonically cleaned in a methanol bath. The clean stack is then heat dried at block 710. The stack is heated to a temperature of 100° C. for a period of 2 hours in a desiccator, such as a vacuum oven using approximately −98 KPa pressure. The heating removes any volatile contaminants. The stack is then cooled at room temperature, as indicated at block 506.

The stack is aligned in the housing by an alignment fixture at block 720. In block 725, the combination in then set in a pneumatic potting fixture located in a vacuum chamber. A large axial load is applied to the stack at block 730, after which the alignment fixture is removed. The load compresses the stack allowing irregular surfaces of the brass electrodes to conform to the irregular surfaces of the ceramic discs. Thus few spaces are formed between the succession of discs, thereby increasing the stiffness of the stack. In the preferred embodiment the force is approximately equal to 8900 Newtons. The chamber is then sealed and a vacuum is created at block 735. The vacuum draws out a sufficient volume of air so that the elastomer fills the remaining microscopic spaces between the electrode/disc juncture. Preferably, the vacuum is applied at −100 KPa.

The application of the adhesive occurs next. In the preferred embodiment the adhesive is a silicone adhesive produced by Dow Corning as product No. Q3-6632. The silicone adhesive is mixed per manufactures instructions. As shown by block 740, the adhesive is injected into the desiccator through a glass tube and into the spaces between the stack and the inside wall of the housing. The vacuum in the chamber is then released, in block 745, providing the silicone elastomer to fill any remaining voids, e.g. microscopic spaces in the stack.

The elastomer is then cured in block 750. In the preferred embodiment, a first curing step is provided at 100° C. for approximately 2 hours. At the first curing step the encapsulant sets, giving the appearance of a hard rubber material. Thereafter, a second curing step is performed at about 145°-150° C. for approximately 4 hours. The second step establishes adhesion of the silicone encapsulant to the ceramic discs. Moreover a coupling agent such as silane may be utilized to further enhance the encapsulant's adhesion characteristics.

Thereafter the stack is then allowed to cool for a period of 1 hour at room temperature, in block 755. At block 760 the axial load is released from the stack and the stack is removed from the pneumatic fixture that is inside the vacuum chamber.

Finally, the housing is ready to be assembled, shown generally at 800 of FIG. 8. The coating of the encapsulant is trimmed at block 805. Block 810 represents the poling process. The poling process consists of applying a voltage to the stack at room temperature. For example, a voltage is ramped-up from 0 volts to 1000 volts, then ramped-down from 1000 volts to 0 volts. At block 820, an end surface 114 of the housing and the exposed surface of one of outer ceramic discs 115 is simultaneously ground to facilitate proper alignment of a steel diaphragm 116 that is laser welded to the housing.

Industrial Applicability

An example of the operation of the piezoelectric solid state motor stack made by the present invention will now be discussed. The main function of the piezoelectric solid state motor stack is to provide actuation at high forces. This is accomplished by applying high electrical potential to each of the piezoelectric discs. In response to receiving the electrical energy, each of the discs "grow" or expand in an axial direction, while "shrinking" or contracting in a radial direction. As each individual disc in the stack expands, the stack likewise expands or displaces. Moreover, once electrical energy is removed from the discs, the discs return to their original form. This expansive feature of piezoelectric material makes the ceramic desirable for many applications requiring actuation.

The present invention is particularly suited towards high force applications. Consequently, the present invention offers improvements to the stiffness characteristics of the piezoelectric actuator. The method of etching the smooth planar surfaces of the electrodes yields an electrode surface which closely "matches" the irregular surface facets of the ceramic discs. Thus, when the stack is assembled and an axial load is applied to the stack, the etched surfaces of the electrodes conform to the irregular surfaces of the discs creating a dense or stiff stack design. Therefore the stack is able to produce greater displacements at higher forces, as compared to conventional high force piezoelectric actuators.

Finally, a small but adequate number of microscopic spaces exist between the electrode/disc juncture, thus allowing the encapsulant to seep into the microscopic spaces thereby bonding the stack together. This leads to a piezoelectric stack which has superior reliability.

Other aspects, objects and advantages of the present invention can be obtained from a study of the drawings, the disclosure and the appended claims.

We claim:

1. A method for making a piezoelectric stack, the stack including a plurality of piezoelectric discs interleaved with a plurality of electrodes, each disc having two opposing surface facets and each electrode having a thin planar section having two opposing planar surfaces adapted to contact a substantial portion of the surface facets of two adjacent discs, comprising:
    cutting a cylindrical piezoelectric ceramic slug into discs, the two opposing surface facets of each disc being formed substantially parallel to one another and having a predetermined surface roughness;
    applying a conductive layer to the surface facets;
    etching the smooth planar surfaces of the electrodes with an acidic solution to corrode the planar surfaces in a manner to achieve a surface roughness of the planer surfaces similar to the predetermined surface roughness of the disc surface facets; and
    alternatively interleaving a first and second plurality of electrodes with a plurality of discs forming the piezoelectric stack.

2. A method, as set forth in claim 1, wherein an elongate tab section is formed integrally with the planar section of the electrode, each elongate tab section having an end portion, and including the steps of:
    bending the elongate tab sections at a substantially right angle from the stack; and
    electrically connecting the end portions of the elongate tab sections of the respective pluralities of electrodes together.

3. A method, as set forth in claim 2, wherein the electrical connecting step includes the step of welding the end portions of the respective pluralities of electrodes together.

4. A method, as set forth in claim 1, wherein the juncture of the surface facets of the discs and the planar surfaces of the electrodes form microscopic spaces and including the steps of:
    aligning the stack in a housing;
    applying a large axial load to the stack; and
    encapsulating the stack with a low viscosity silicone adhesive having thermal properties under a vacuum such that the adhesive fills an area between the stack and the housing, and the microscopic spaces.

5. A method, as set forth in claim 4, including the step of curing the silicone adhesive so that the adhesive acts as a bonding agent between the discs and electrodes.

6. A method, as set forth in claim 1, wherein the cutting step is performed by an inner diameter circular saw.

* * * * *